(12) United States Patent
Chae et al.

(10) Patent No.: US 11,545,968 B1
(45) Date of Patent: Jan. 3, 2023

(54) ACTIVE SUPPRESSION CIRCUITRY

(71) Applicant: Cadence Design Systems, Inc., San Jose, CA (US)

(72) Inventors: Moo Sung Chae, Cary, NC (US); Thomas Evan Wilson, Laurel, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 302 days.

(21) Appl. No.: 16/877,123

(22) Filed: May 18, 2020

(51) Int. Cl.
*H03K 5/1252* (2006.01)
*G11C 5/14* (2006.01)
*H03H 7/06* (2006.01)
*H03F 3/45* (2006.01)

(52) U.S. Cl.
CPC ............. *H03K 5/1252* (2013.01); *G11C 5/14* (2013.01); *H03F 3/45475* (2013.01); *H03H 7/06* (2013.01)

(58) Field of Classification Search
CPC ........ H03K 5/1252; H03K 17/16; G11C 5/14; H03F 3/45475; H03H 7/06
See application file for complete search history.

(56) References Cited

U.S. PATENT DOCUMENTS 4,847,567 A * 7/1989 Fenk .................. H03L 5/00
331/109

* cited by examiner

*Primary Examiner* — Jung Kim
(74) *Attorney, Agent, or Firm* — Schwegman Lundberg & Woessner, P.A.

(57) ABSTRACT

Various embodiments provide for active suppression circuitry. The active suppression circuitry can be used with a circuit for a memory system, such as a dual data rate (DDR) memory system. For example, some embodiments provide an active suppression integrated circuit. The active suppression integrated circuit can be used by a memory system to efficiently suppress power supply noise caused by resonance of a power delivery network (PDN) of the memory system, thereby improving power integrity of the memory system input/output.

20 Claims, 9 Drawing Sheets

ACTIVE SUPPRESSION CIRCUITRY

TECHNICAL FIELD

Embodiments described herein relate to memory and, more particularly, to active suppression circuitry, which can be used with a circuit for a memory system.

BACKGROUND

Memory traffic can comprise write and read bursts with low-power idle periods in between the bursts. To optimize computational throughput of a host system, a central processor unit (CPU) and a controller of the host system usually dictate traffic frequency and data pattern of memory (e.g., dual data rate (DDR) memory). Some computing systems can have very large memory interfaces on a single system-on-a-chip (SOC), and several recent DDR-based memory systems use a large number of parallel input/outputs to achieve desired data bandwidth between memory and a SOC.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
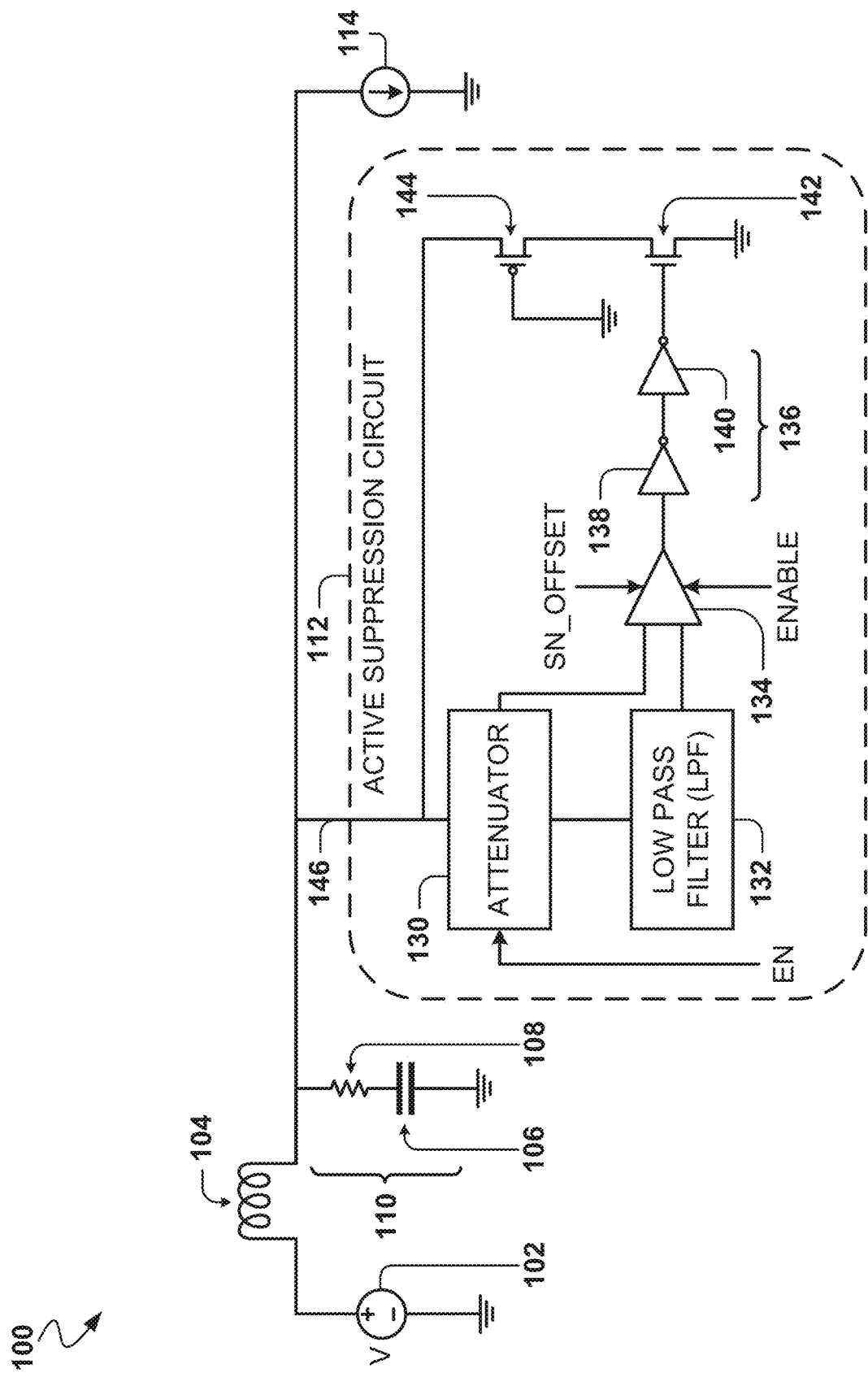
FIG. 1 is a schematic illustrating an example circuit that comprises an example active suppression circuit, in accordance with various embodiments.

A memory physical (PHY) layer, such as a DDR PHY, usually has no control over or advanced knowledge of the magnitude or frequency of current draw that will occur during memory traffic. Unfortunately, with increased data rates of modern DDR interfaces, memory write/read/idle patterns now occur at higher frequencies and can resonate the power delivery network (PDN) and circuit package. Additionally, power supply noise in a memory system can be a critical issue that limits performance of a memory link. With the random nature of the data patterns, it is inevitable for the memory input/output to suffer from large power supply noise when the frequency of the simultaneous switching noise (SSN) is close to the resonance frequency of the PDN.

Traditional methods for addressing this resonance issue can be unsuitable for certain applications, especially with respect to a memory integrated circuit. For example, a method for maintaining leveled and balanced traffic, such as those used in SerDes, can be inappropriate for memory systems because of the lack of data coding and because of memory's unique need for low-latency transactions. A passive snubber/damping circuit or device usually relies on extensive manual tuning (making it difficult to use) and the size of such a damping circuitry can be large enough to make it undesirable to add to an on-chip integrated circuit (e.g., on-chip memory integrated circuit). Additionally, increasing the size of on-die decoupling capacitor can be undesirable for memory input/output (e.g., the area required by the capacitor can be too large and the relatively small series resistance of the on-die capacitor compared to that of the on-board/system level decoupling capacitor can result in peak resonance impedance that is larger than desirable).

Various embodiments provide for active suppression circuitry, which can be used with a circuit for a memory system, such as a DDR memory system. For example, some embodiments provide an active suppression integrated circuit, which can be used by a memory system to efficiently suppress power supply noise (e.g., large power supply noise) caused by resonance of a PDN of the memory system, thereby improving power integrity of the memory system input/output. The active suppression circuit of some embodiments can detect large power supply noise on a PDN, and can trigger a suppression device (e.g., an active clamp circuit) that can absorb (e.g., quickly absorb) alternating current by resonance in the PDN. The active suppression circuit of some embodiments can be small, easy to use, and integrated on-die with minimal extra power consumption by the die (e.g., memory die).

According to some embodiments, the active suppression circuit comprises an attenuator, a low-pass filter (LPF), an operational amplifier (e.g., error amplifier), driving stages, and a suppression device (e.g., dampening, clamping, or snubbing device). Additionally, the active suppression circuit can comprise ports for one or more of the following: power; ground; offset control for the operational amplifier; and circuit enable. For some embodiments, the active suppression circuit can activate the suppression device, to provide (e.g., form or enable) a shorting path (e.g., shorting, low-impedance path) between a power supply network (e.g., an on-chip PDN) and ground, whenever power noise on the power supply network meets or exceeds a threshold (e.g., gets sufficiently large), thereby causing power (e.g., current) to be drawn from the power supply network via the suppression device. The low-impedance path provided (e.g., enabled or formed) by the suppression device (when active) can absorb excess current from the power supply network, thereby suppressing the power noise. When the suppression device is inactive (e.g., deactivated), the shorting path can be disabled (e.g., can cease to exist) and the power draw by the suppression device ceases. The power draw caused via the shorting path (e.g., shorting snubber path) can be brief to avoid excessive power draw. For example, with respect to a power supply network of a memory system (e.g., on-chip memory system), the suppression device can be active (and the shorting path enabled) for very short periods of time at the beginning and end of memory traffic bursts, and not active during more quiet periods.

As used herein, a suppression device can comprise a snubber, a clamping device, or a dampening device.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a schematic illustrating an example circuit 100 that comprises an example active suppression circuit 112, in accordance with various embodiments. Depending on the embodiment, the circuit 100 can form part of a larger circuit, such as a memory circuit. For some embodiments, the circuit 100 represents the active suppression circuit 112 operatively coupled to a power network (e.g., power supply network or power delivery network (PDN)) of an integrated circuit. As shown, the circuit 100 comprises a voltage source 102, an inductor 104, a resistor 108, the active suppression circuit 112, and a capacitor 106. Where the active suppression circuit 112 is part of a die within a package (e.g., integrated circuit within a chip package), the voltage source 102 can represent the power network (e.g., PDN) of the circuit 100, the inductor 104 can represent an inductive property of the package, the series 110 can represent an on-die capacitance of the circuit 100 (e.g., integrated circuit), and current 114 can represent the current within the chip.

As shown the active suppression circuit 112 comprises an attenuator 130, a low-pass filter (LPF) 132, an operational amplifier 134, a driving stage 136, a n-type transistor 142 (e.g., NMOS transistor), and a p-type transistor 144 (e.g., PMOS transistor). The driving stage 136 comprises an inverter 138 and an inverter 140 coupled in series. For some embodiments, the driving stage 136 comprises more or fewer inverters (or other driving components) than what is illustrated for the active suppression circuit 112. According to some embodiments, the attenuator 130 is coupled (via a circuit input port 146 of the active suppression circuit 112) to a power network of the circuit 100. The LPF 132 is coupled to an output of the attenuator 130. The operational amplifier 134 comprises two inputs, one of which is coupled to the output of the attenuator 130, and the other of which is coupled to an output of the LPF 132. For some embodiments, the operational amplifier 134 operates as an error amplifier for the active suppression circuit 112. The driving stage 136 is coupled to an output of the operational amplifier 134.

For some embodiments, the n-type transistor 142 and the p-type transistor 144 form a suppression device (e.g., dampening, clamping, or snubbing device) that also couples (via the circuit input port 146 of the active suppression circuit 112) to a power network of the circuit 100. As shown, the gate of the n-type transistor 142 is coupled to the output of the driving stage 136, the source of the n-type transistor 142 is coupled to the drain of the p-type transistor 144, the drain of the n-type transistor 142 is coupled to ground, the gate of the p-type transistor 144 is coupled to ground, and the source of the p-type transistor 144 is coupled to the circuit input port 146. The n-type transistor 142 can comprise an n-channel MOSFET device, and the p-type transistor 144 can comprise a p-channel MOSFET device. For some embodiments, the p-type transistor provides at least the suppression device (if not the active suppression circuit) with electrostatic discharge (ESD) protection.

Depending on the embodiment, the attenuator 130 can comprise a simple voltage divider that converts a common mode level of a power supply noise (which is at supply level) to an optimal level for the operational amplifier 134. An EN input of the attenuator 130 can control whether the attenuator 130 is enabled or disabled. Likewise, an EN input of the operational amplifier 134 can control whether the operational amplifier 134 is enabled or disabled. For some embodiments, enabling the attenuator 130 (via its EN input) and the operational amplifier 134 (via its EN input) results in the active suppression circuit 112 being enabled. Additionally, for some embodiments, disabling either the attenuator 130 (via its EN input), the operational amplifier 134 (via its EN input), or both results in the active suppression circuit 112 being disabled.

The LPF 132 can be used to generate (e.g., extract) a reference voltage for the operational amplifier 134. For some embodiments, the cut-off frequency of the LPF 132 is low enough compared to the resonance frequency of the power network (e.g., PDN) of the circuit 100 such that the differential signal (of the optimal level signal and a reference voltage) applied to the operational amplifier 134 results in the operational amplifier 134 effectively functioning as a high-pass filter. Additionally, for some embodiments, the operational amplifier 134 has bandwidth that is higher than the power network (e.g., PDN) resonance frequency.

According to various embodiments, a suppression (e.g., dampening, clamping, or snubbing) action is triggered by the active suppression circuit 112 in response to the active suppression circuit 112 detecting power noise (e.g., power supply noise) via the circuit input port 146 meeting or excessing a threshold voltage level higher than the reference voltage provided (e.g., extracted) by the LPF 132. Depending on the embodiment, the threshold voltage level of the suppression action can be set via an SN_OFFSET input (e.g., comprising control bits SN_OFFSET[2:0]) to the operational amplifier 134, which can control an offset control of the operational amplifier 134. For various embodiments, the offset control of the operational amplifier 134 applies an input offset voltage to the output of the operational amplifier 134 based on the SN_OFFSET input. For some embodiments, the input offset voltage of the operational amplifier 134 is adjusted (e.g., via the SN_OFFSET input) in accordance with a mirroring ratio of a current mirroring stage.

For various embodiments, the active suppression circuit 112 is configured to activate a suppression action on positive voltage excursions of the power supply and not negative voltage excursions. The suppression action of various embodiments comprises reduced positive excursions on the power network implemented by the circuit 100 shorting (with low impedance) the power network with ground, thereby drawing power from the power network (e.g., for brief periods of times). By selectively activating the suppression action, the impedance of the power network can be selectively lowered for positive excursions. In doing so, the active suppression circuit 112 can reduce power supply transients at (or close to) ideal effectiveness, while reducing resonant oscillations on the power network.

The suppression action of the active suppression circuit 112 can be bandwidth (band) limited, for instance, by a conditioner filter and a frequency response of the operational amplifier 134 and the suppression device (formed by the n-type transistor 142 and the p-type transistor 144). For some embodiments, the active suppression circuit 112 is configured such that the bandwidth of the suppression action matches the resonant peak oscillation of the circuit to which the active suppression circuit 112 is coupled. For instance, with respect to the circuit 100, the active suppression circuit 112 is configured such that the bandwidth of the suppression action matches the resonant peak oscillation of the network (e.g., the power network and package of a SOC) implemented by the circuit 100. Certain application-dependent limitations, such as package pin impedance, can cause the resonant peak oscillation to have a frequency range (e.g., between 20 MHz to 300 MHz) where off-die decoupling is effective below the frequency range, and the intrinsic and explicit decoupling capacitance are effective above that frequency range.

Figure 2:
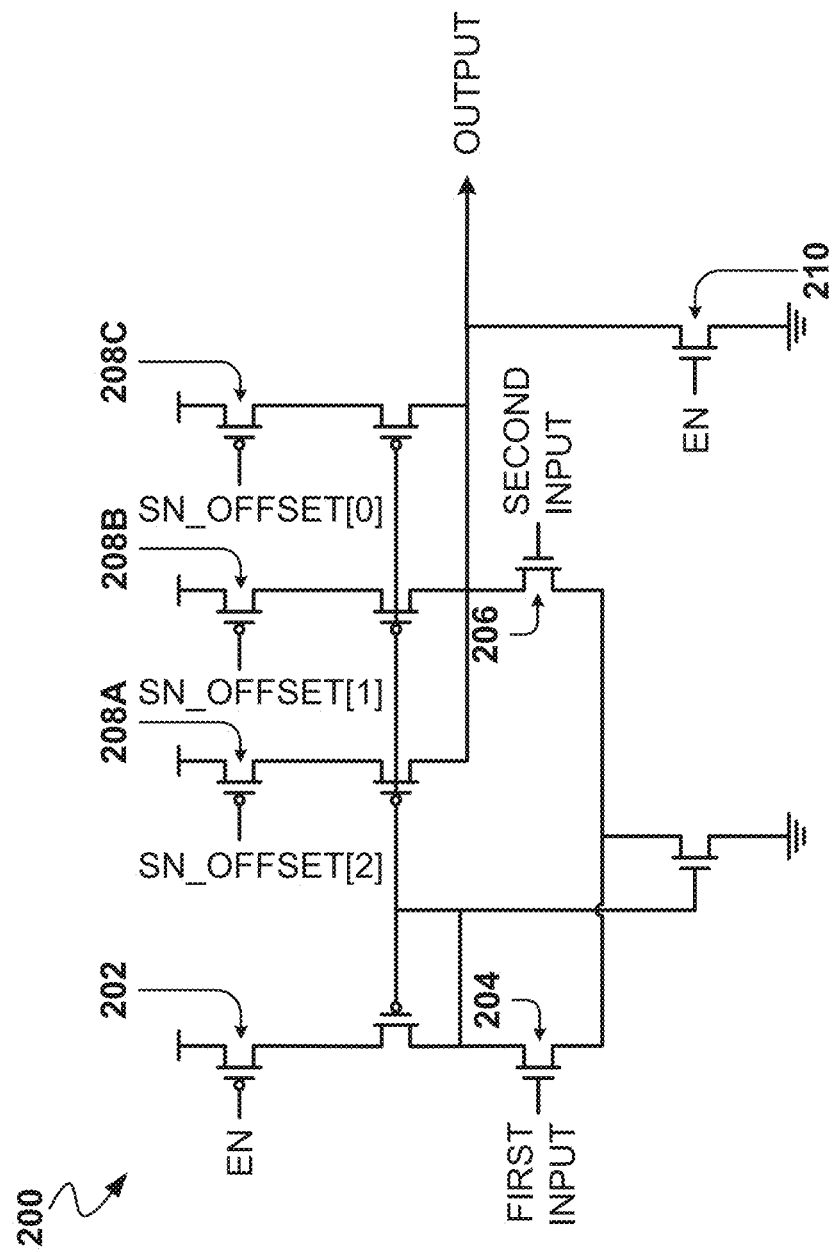
FIG. 2 is a schematic illustrating an example operational amplifier of an example active suppression circuit, in accordance with various embodiments.

FIG. 2 is a schematic illustrating an example operational amplifier 200 of an example active suppression circuit, in accordance with various embodiments. According to some embodiments, the operational amplifier 134 of the active suppression circuit 112 comprises the operational amplifier 200 of FIG. 2. As shown, the operational amplifier 200 comprises a network of n-type and p-type transistors. For the operational amplifier 200, an EN input is coupled to the gates of a p-type transistor 202 and a gate of a n-type transistor 210; the EN input can enable or disable operation of the operational amplifier 200. A first input coupled to the gate of an n-type transistor 204 and a second input coupled to the gate of an n-type transistor 206 can serve as the inputs of the operational amplifier 200 (e.g., coupled to the outputs of the attenuator 130 and the LPF 132 of the active suppression circuit 112). An output of the operational amplifier 200 (e.g., which can be coupled to the driving stage 136 of the active suppression circuit 112) is also shown. Input bits provided via an SN_OFFSET input to the operational amplifier 200 (e.g., bits SN_OFFSET[2:0]) are couple d top-type transistors 208A, 208B, 208C. As described herein, the SN_OFFSET input can control an input voltage offset applied to the output of the operational amplifier 200.

Figure 3:
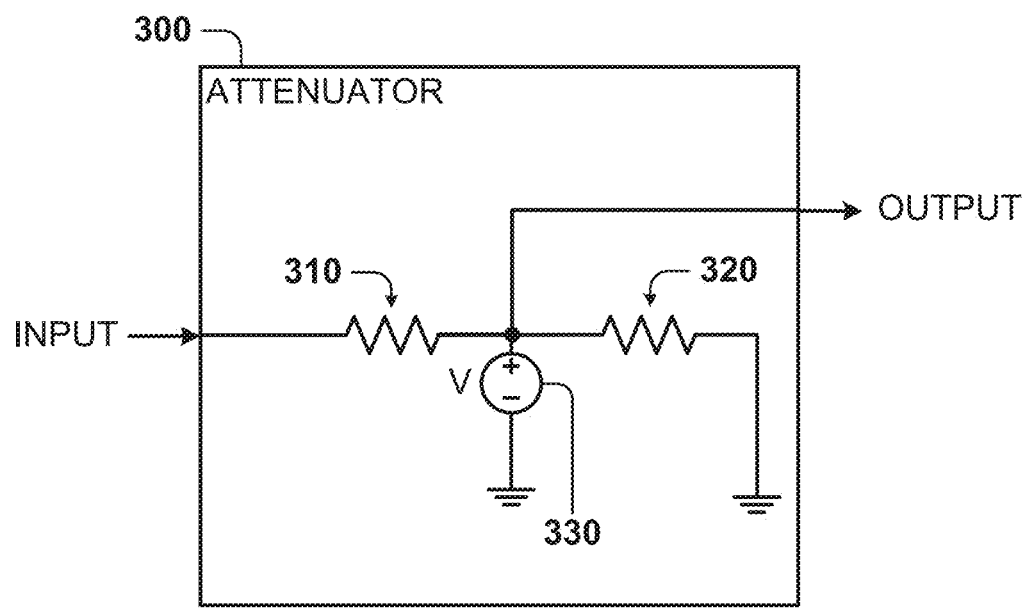
FIG. 3 is a schematic illustrating an example attenuator of an example active suppression circuit, in accordance with various embodiments.

FIG. 3 is a schematic illustrating an example attenuator 300 of an example active suppression circuit, in accordance with various embodiments. According to some embodiments, the attenuator 130 of the active suppression circuit 112 comprises the attenuator 300 of FIG. 3. As shown, the attenuator 130 comprises resistors 310, 320 and a voltage source 330. During operation, the attenuator 130 receives an input and divides the voltage based on the resistors 310 and 320 to generate an attenuated voltage output. The resistor values of each of the resistors 310, 320 can determine the voltage level of the attenuated voltage output, and can vary between different embodiments.

Figure 4:
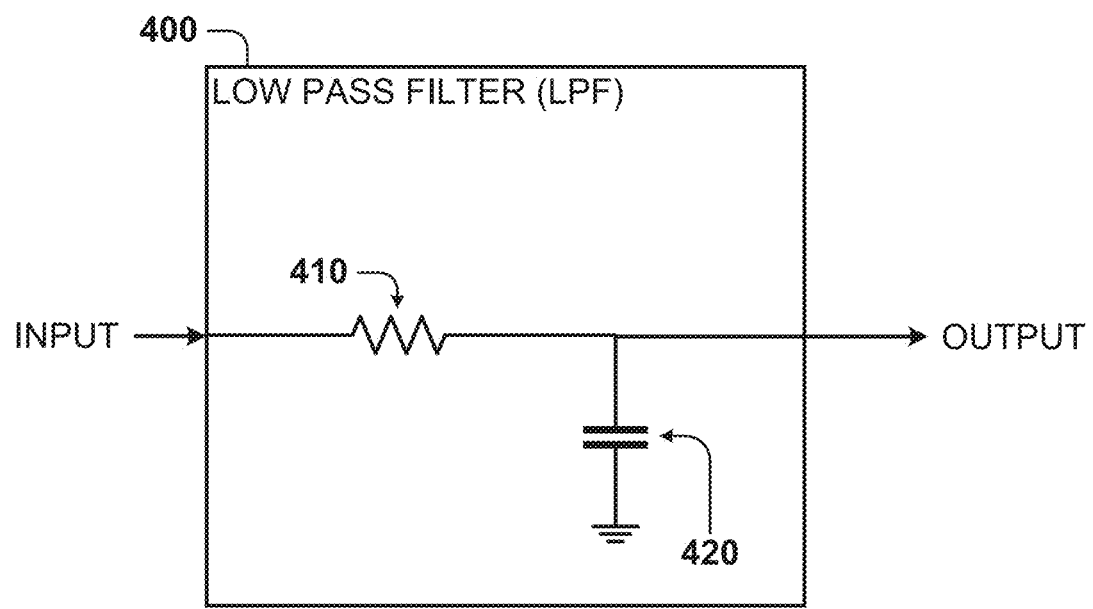
FIG. 4 is a schematic illustrating an example low-pass filter (LPF) of an example active suppression circuit, in accordance with various embodiments.

FIG. 4 is a schematic illustrating an example low-pass filter (LPF) 400 of an example active suppression circuit, in accordance with various embodiments. According to some embodiments, the LPF 132 of the active suppression circuit 112 comprises the LPF 400 of FIG. 4. As shown, the LPF 132 comprises a resistor 410 and a capacitor 420. During operation, the LPF 132 receives an input and generates a filtered output. For various embodiments, the RC value of the resistor 410 and the capacitor 420 can determine the frequency response (and thus the filtered output) of the LPF 400.

Figure 5:
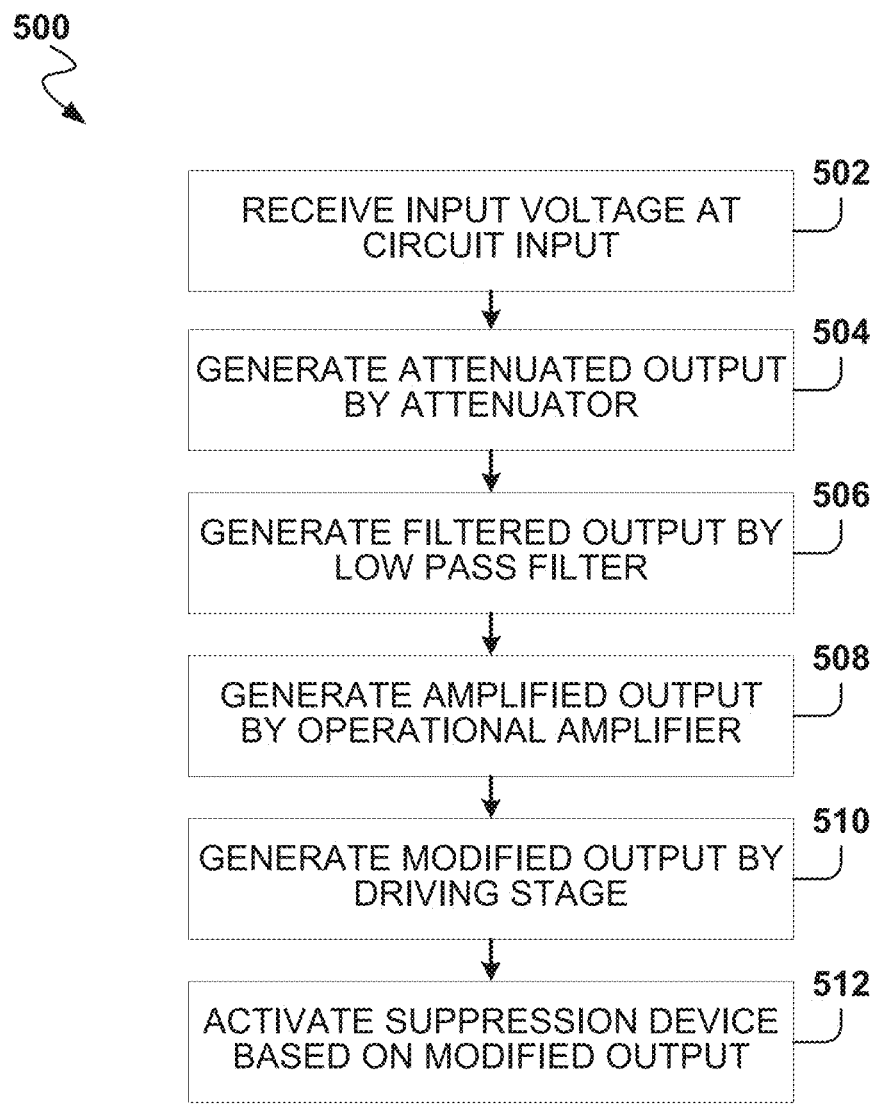
FIG. 5 is a flowchart illustrating an example method for an example active suppression circuit, in accordance with various embodiments.

FIG. 5 is a flowchart illustrating an example method 500 for an example active suppression circuit, in accordance with various embodiments. Some or all of the method 500 can be performed by an active suppression circuit (e.g., 112) coupled to a larger circuit. For example, the method 500 can be performed by an active suppression circuit that forms part of a larger integrated circuit, such as a memory integrated circuit (e.g., having a DDR memory interface). Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 5, the method 500 begins with operation 502, a circuit input of a circuit (e.g., the active suppression circuit 112) receiving an input signal. For some embodiments, the circuit input is coupled to a power network (e.g., PDN) of a larger network (e.g., memory integrated circuit). The circuit (e.g., the active suppression circuit 112) and the power network can form part of an integrated circuit die. For example, the circuit and the power network can form part of a memory integrated circuit, such as one that comprises a hardware interface (e.g., PHY interface) according to a DDR standard (e.g., DDR4 or DDR5). As described herein, for some embodiments, an active suppression circuit described herein is used to suppress power noise cause by resonance of a power network (e.g., PDN). For instance, with respect to a power network of a memory-integrated circuit supporting DDR memory input/output, the circuit (e.g., the active suppression circuit 112) can activate a suppression device of the circuit to draw power from the circuit input at least before and after a traffic burst over the hardware interface (e.g., DDR PHY interface).

At operation 504, an attenuator (e.g., the attenuator 130) of the circuit generates an attenuated output based on the input signal received by operation 502.

At operation 506, a low-pass filter (e.g., the LPF 132) of the circuit generates a filtered output based on the attenuated output generated by operation 504.

The method 500 continues with operation 508, where an operational amplifier of the circuit generates an amplified output based on the attenuated output (generated by operation 504) and the filtered output (generated by operation 506). For some embodiments, the operational amplifier has offset control. For example, the amplified output generated by the operational amplifier can be offset (by an input voltage offset) based on an offset control signal received via an input of the operational amplifier. For some embodiments, the input voltage offset applied by the operational amplifier determines the threshold voltage level for activating/deactivating a suppression action of the circuit (the threshold voltage level determining when a suppression device of the circuit is active and inactive). Though not illustrated in FIG. 5, the method 500 can include an operation where the offset of the operational amplifier is adjusted by adjusting the offset control signal.

Based on the amplified output (generated by operation 508), at operation 510, a driving stage (e.g., the driving stage 136) of the circuit generates a modified output. For some embodiments, the driving stage comprises a plurality of inverters (or other driver components) coupled in series.

At operation 512, a suppression device (e.g., comprising the n-type transistor 142 and the p-type transistor 144) of the circuit is activated based on the modified output generated by operation 510. For various embodiments, the suppression device draws power (e.g., current) from the circuit input when the suppression device is active. As described herein, when active, the suppression device can cause power to be drawn from the circuit input (e.g., from a power network coupled to the circuit input) by forming/enabling a (low-impedance) shorting path between the circuit input and ground. When the suppression device is deactivated, the shortening path can be disabled (e.g., can cease to exist), and the suppression device can stop drawing power from the circuit input.

Figure 6:
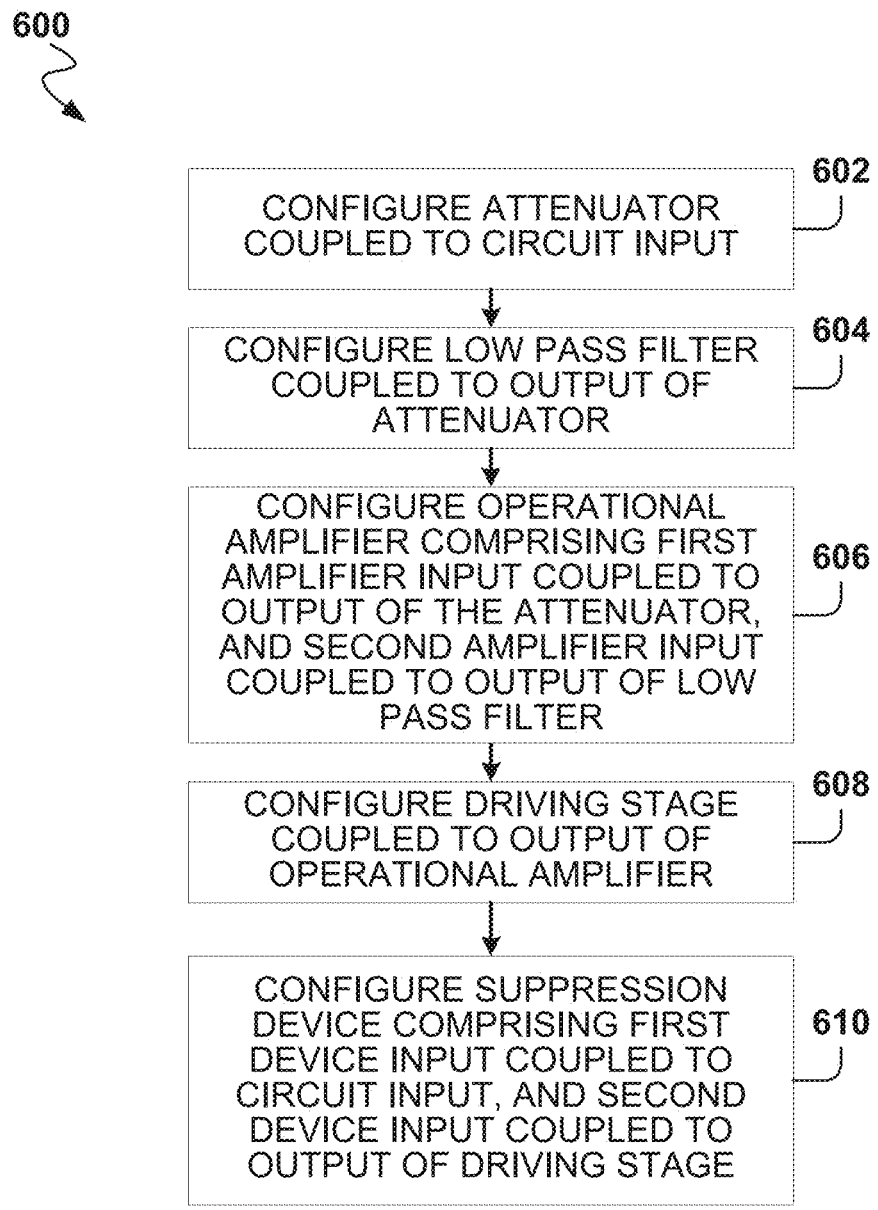
FIG. 6 is a flowchart illustrating an example method for generating a circuit design including an example active suppression, in accordance with various embodiments.

FIG. 6 is a flowchart illustrating an example method 600 for generating a circuit design including an example active suppression, in accordance with various embodiments. It will be understood that the method 600 can be performed by a device, such as a computing device executing instructions of an EDA software system, in accordance with some embodiments. Additionally, the method 600 herein can be implemented in the form of executable instructions stored on a computer-readable medium or in the form of electronic circuitry. For instance, the operations of the method 600 may be represented by executable instructions that, when executed by a processor of a computing device, cause the computing device to perform the method 600. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 6, the method 600 begins with operation 602, where an attenuator coupled to a circuit input is configured within a circuit design. For some embodiments, the circuit input is configured to be coupled to a power network of a larger circuit (e.g., a memory-integrated circuit). At operation 604, a low-pass filter coupled to an output of the attenuator is configured within the circuit design. At operation 606, an operational amplifier is configured within the circuit design, where the operational amplifier comprises a first amplifier input and a second amplifier input, where the first amplifier input is coupled to the output of the attenuator, and where the second amplifier input is coupled to an output of the low-pass filter. At operation 608, a driving stage coupled to an output of the operational amplifier is configured within the circuit design. At operation 610, a suppression device is configured within the circuit design, where the suppression device comprises a first device input and a second device input, where the first device input is coupled to the circuit input, and where the second device input is coupled to an output of the driving stage. According to various embodiments, the suppression device (configured by operation 610) comprises a p-type transistor and an n-type transistor, where the first device input is coupled to a source of the p-type transistor, where a drain of the p-type transistor is coupled to a source of the n-type transistor, where a drain of the n-type transistor is coupled to ground, where a gate of the p-type transistor is coupled to ground, and where a gate of the n-type transistor is coupled to the second device input.

Figure 7:
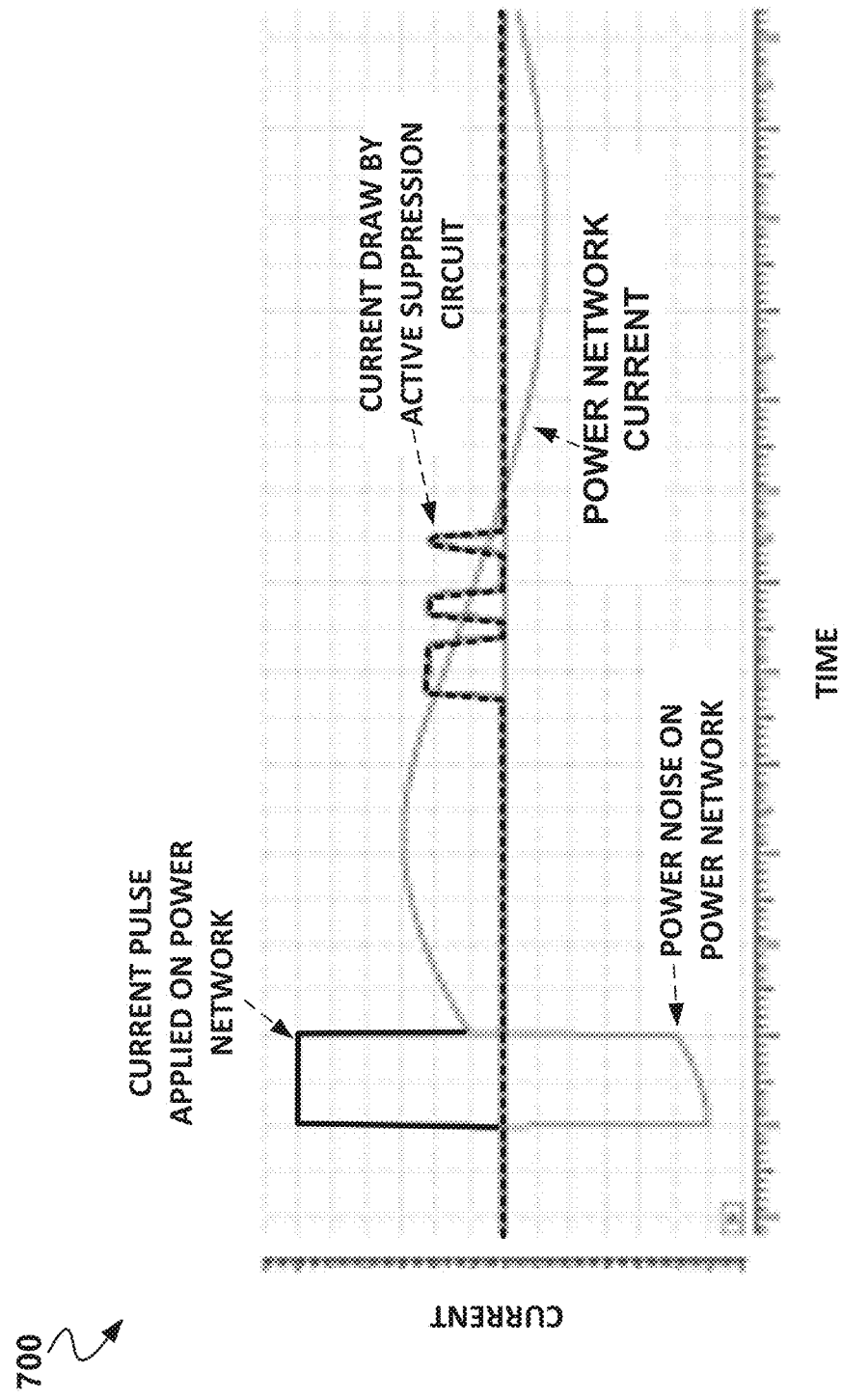
FIG. 7 is a graph illustrating current output of an example active suppression circuit being used with a power network, in accordance with various embodiments.

FIG. 7 is a graph 700 illustrating current output of an example active suppression circuit being used with a power network, in accordance with various embodiments. In particular, the graph 700 illustrates a single current pulse being applied to an on-die power network (e.g., PDN), and power noise being generated on the on-die power network in response. The power noise of the decaying ripple is due to the resonance formed by the on-die power network and on-die decoupling capacitors. According to various embodiments, when the voltage output of an attenuator (e.g., 130) of the active suppression network (e.g., 112) becomes larger than an input offset voltage of an operational amplifier (e.g., 134) of the active suppression circuit (e.g., adjusted by control bits SN_OFFSET[2:0]), then the n-type transistor (e.g., 142) of a suppression device of the active suppression circuit is turned activated and, as such, causes the suppression device (of the active suppression circuit) to absorb resonance current flow from the on-die power network. This is illustrated in the graph 700 as the current draw by the activate suppression circuit. The suppression action of the activate suppression circuit can continue until the sensed voltage of the power noise falls below the input offset voltage of the operational amplifier (e.g., 134). As shown in the graph 700, multiple suppression actions can occur based on the amplitude of the resonance current and the on-die power network.

Figure 8:
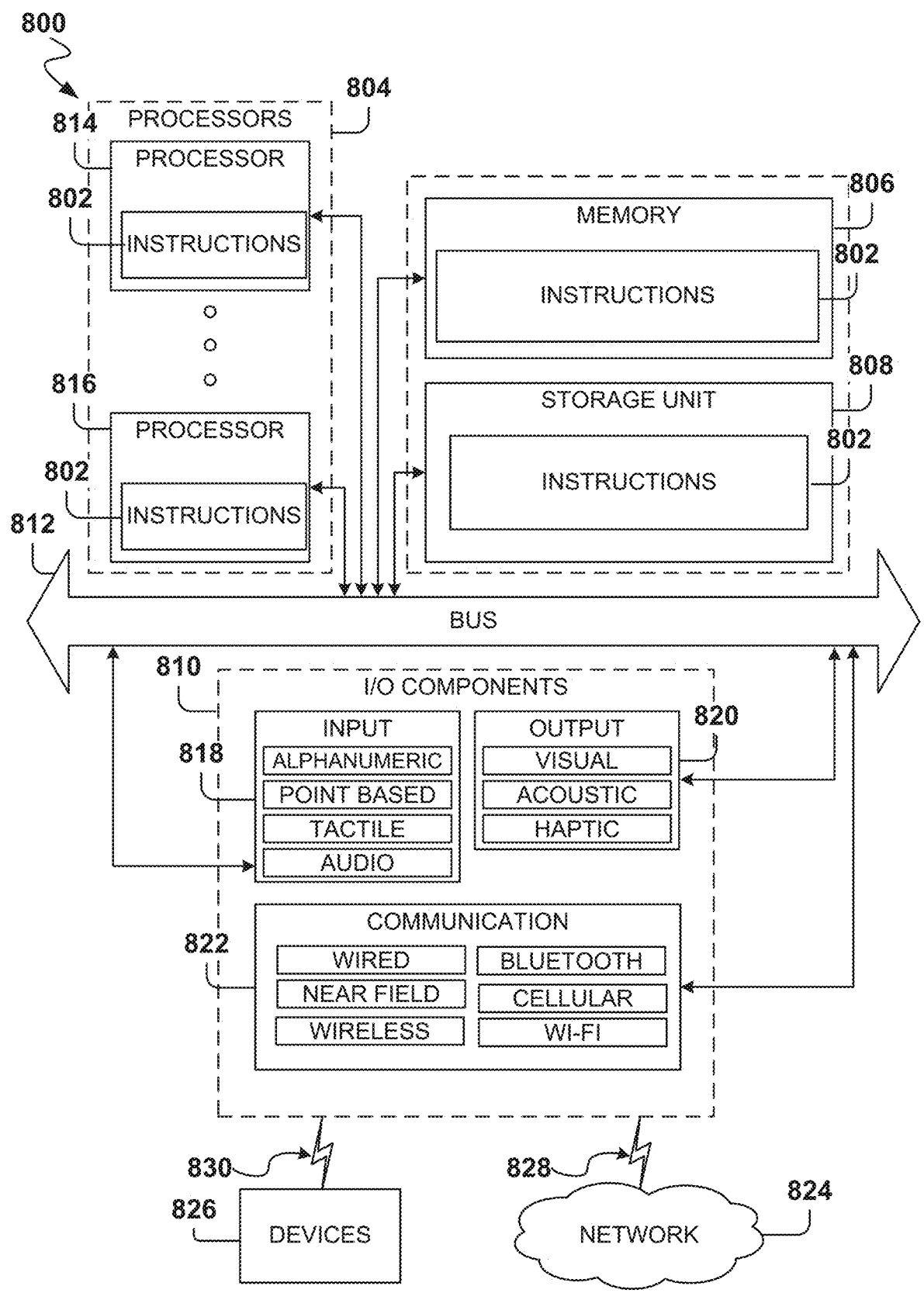
FIG. 8 is a block diagram illustrating components of a machine, according to some example embodiments, able to read instructions from a machine-readable medium and perform any one or more of the methodologies discussed herein.

FIG. 8 is a block diagram illustrating components of a machine 800, according to some example embodiments, able to read instructions from a machine-readable medium (e.g., a machine-readable storage medium) and perform any one or more of the methodologies discussed herein. Specifically, FIG. 8 shows a diagrammatic representation of the machine 800 in the example form of a system, within which instructions 802 (e.g., software, a program, an application, an applet, an app, a driver, or other executable code) for causing the machine 800 to perform any one or more of the methodologies discussed herein may be executed. For example, the instructions 802 include executable code that causes the machine 800 to execute the method 600. In this way, these instructions 802 transform the general, non-programmed machine 800 into a particular machine programmed to carry out the described and illustrated method 600 in the manner described herein. The machine 800 may operate as a standalone device or may be coupled (e.g., networked) to other machines.

By way of non-limiting example, the machine 800 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 802, sequentially or otherwise, that specify actions to be taken by the machine 800. Further, while only a single machine 800 is illustrated, the term "machine" shall also be taken to include a collection of machines 800 that individually or jointly execute the instructions 802 to perform any one or more of the methodologies discussed herein.

The machine 800 may include processors 804, memory 806, a storage unit 808, and I/O components 810, which may be configured to communicate with each other such as via a bus 812. In an example embodiment, the processors 804 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 814 and a processor 816 that may execute the instructions 802. The term "processor" is intended to include multi-core processors 804 that may comprise two or more independent processors (sometimes referred to as "cores") that may execute instructions 802 contemporaneously. Although FIG. 8 shows multiple processors 804, the machine 800 may include a single processor with a single core, a single processor with multiple cores (e.g., a multi-core processor), multiple processors with a single core, multiple processors with multiple cores, or any combination thereof.

The memory 806 (e.g., a main memory or other memory storage) and the storage unit 808 are both accessible to the processors 804 such as via the bus 812. The memory 806 and the storage unit 808 store the instructions 802 embodying any one or more of the methodologies or functions described herein. The instructions 802 may also reside, completely or partially, within the memory 806, within the storage unit 808, within at least one of the processors 804 (e.g., within the processor's cache memory), or any suitable combination thereof, during execution thereof by the machine 800. Accordingly, the memory 806, the storage unit 808, and the memory of the processors 804 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 802. The term "machine-readable medium" shall also be taken to include any medium, or combination of multiple media, that is capable of storing instructions (e.g., instructions 802) for execution by a machine (e.g., machine 800), such that the instructions, when executed by one or more processors of the machine (e.g., processors 804), cause the machine to perform any one or more of the methodologies described herein (e.g., method 600). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 810 may include a wide variety of components to receive input, provide output, produce output, transmit information, exchange information, capture measurements, and so on. The specific I/O components 810 that are included in a particular machine 800 will depend on the type of the machine 800. For example, portable machines such as mobile phones will likely include a touch input device or other such input mechanisms, while a headless server machine will likely not include such a touch input device. It will be appreciated that the I/O components 810 may include many other components that are not specifically shown in FIG. 8. The I/O components 810 are grouped according to functionality merely for simplifying the following discussion and the grouping is in no way limiting. In various example embodiments, the I/O components 810 may include input components 818 and output components 820. The input components 818 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 820 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 810 may include communication components 822 operable to couple the machine 800 to a network 824 or devices 826 via a coupling 828 and a coupling 830 respectively. For example, the communication components 822 may include a network interface component or another suitable device to interface with the network 824. In further examples, the communication components 822 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 826 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 9:
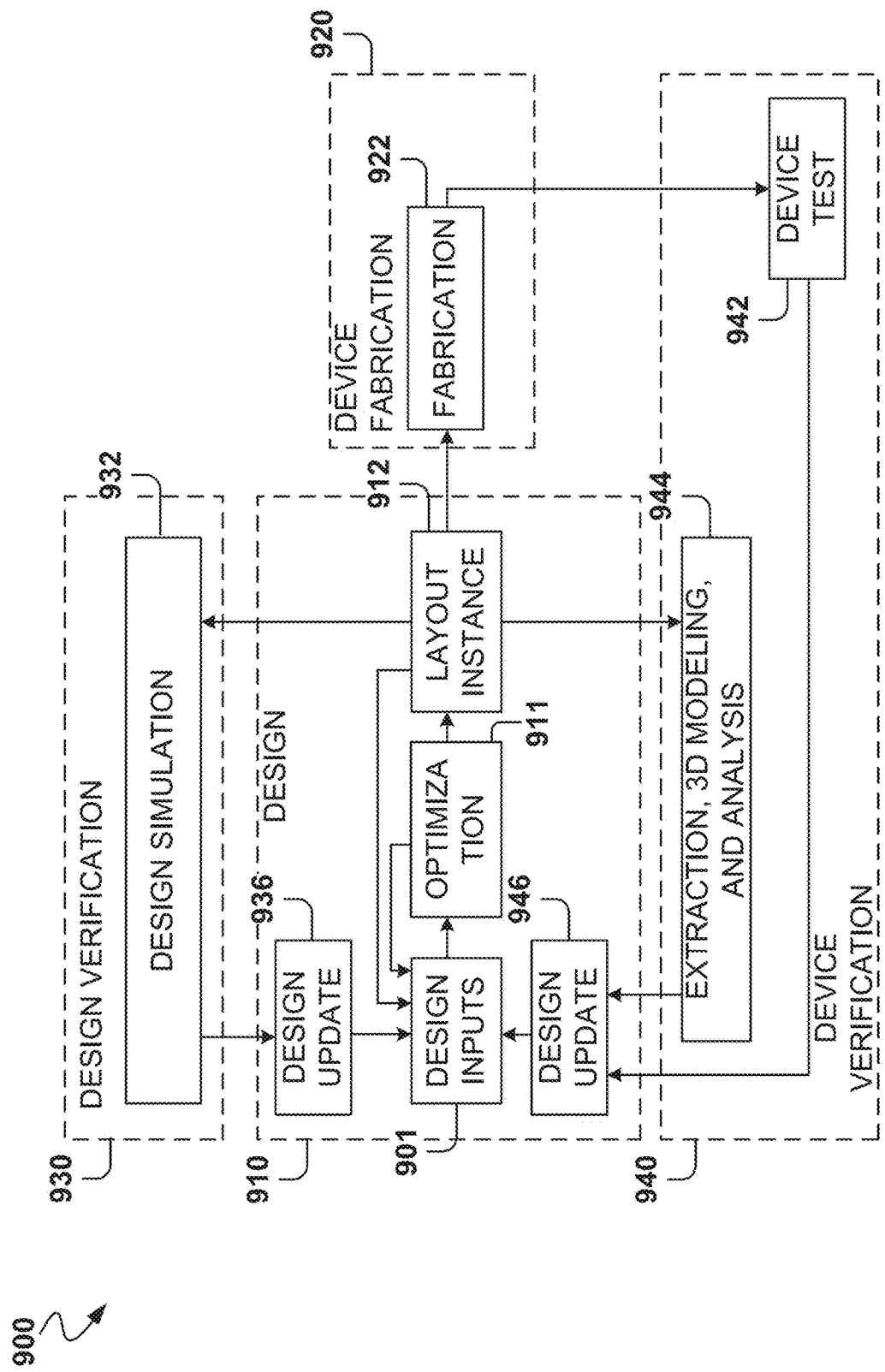
FIG. 9 is a diagram illustrating one possible design process flow for generating a circuit, including embodiments to implement an active suppression circuit as described herein, and in various embodiments, to integrate the active suppression circuit with a larger integrated circuit.

FIG. 9 is a diagram illustrating one possible design process flow for generating a circuit, including embodiments to implement an active suppression circuit as described herein, and in various embodiments, to integrate the active suppression circuit with a larger integrated circuit (e.g., memory-integrated circuit). As illustrated, the overall design flow 900 includes a design phase 910, a device fabrication phase 920, a design verification phase 930, and a device verification phase 940. The design phase 910 involves an initial design input operation 901 where the basic elements and functionality of a device are determined, as well as revisions based on various analyses and optimization of a circuit design. This design input operation 901 is where instances of an EDA circuit design file are used in the design and any additional circuitry is selected. The initial strategy, tactics, and context for the device to be created are also generated in the design input operation 901, depending on the particular design algorithm to be used.

In some embodiments, following an initial selection of design values in the design input operation 901, timing analysis and optimization according to various embodiments occurs in an optimization operation 911, along with any other automated design processes. One such process may be the automated design of a partitioned root search for error locator polynomial functions in RS FEC decoding. As described below, design constraints for blocks of a circuit design generated with design inputs in the design input operation 901 may be analyzed using hierarchical timing analysis, according to various embodiments. While the design flow 900 shows such optimization occurring prior to a layout instance 912, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 922.

After design inputs are used in the design input operation 901 to generate a circuit layout, and any optimization operations 911 are performed, a layout is generated in the layout instance 912. The layout describes the physical layout dimensions of the device that match the design inputs. This layout may then be used in the device fabrication operation 922 to generate a device, or additional testing and design updates may be performed using designer inputs or automated updates based on design simulation 932 operations or extraction, 3D modeling, and analysis 944 operations. Once the device is generated, the device can be tested as part of device test 942 operations, and layout modifications generated based on actual device performance.

As described in more detail below, design updates 936 from the design simulation 932, design updates 946 from the device test 942, the 3D modeling and analysis 944 operations, or the design input operation 901 may occur after an initial layout instance 912 is generated. In various embodiments, whenever design inputs are used to update or change an aspect of a circuit design, a timing analysis and optimization operation 911 may be performed.

For example, in various embodiments, a user may provide an input to a computing device indicating placement of elements of a circuit within a first portion of a circuit design, including description of circuitry for a multi-channel memory interface described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
   an attenuator coupled to a circuit input;
   a low-pass filter coupled to an output of the attenuator;
   an operational amplifier comprising a first amplifier input coupled to the output of the attenuator, and a second amplifier input coupled to an output of the low-pass filter;
   a driving stage coupled to an output of the operational amplifier; and
   a suppression device comprising a first device input coupled to the circuit input, and a second device input coupled to an input of the driving stage.

2. The circuit of claim 1, wherein the suppression device draws power from the first device input when the suppression device is active.

3. The circuit of claim 1, wherein the driving stage comprises a plurality of inverters coupled in series.

4. The circuit of claim 1, wherein the operational amplifier has offset control.

5. The circuit of claim 1, wherein the operational amplifier comprises a third input, an amplified output provided by the output of the operational amplifier being offset by the operational amplifier based on an offset control signal received via the third input.

6. The circuit of claim 5, wherein the amplified output determines a threshold voltage level for the circuit, the threshold voltage level determining when the suppression device is active and inactive.

7. The circuit of claim 1, wherein the suppression device comprises a p-type transistor and an n-type transistor, wherein the first device input is coupled to a source of the p-type transistor, wherein a drain of the p-type transistor is coupled to a source of the n-type transistor, wherein a drain of the n-type transistor is coupled to ground, wherein a gate of the p-type transistor is coupled to ground, and wherein a gate of the n-type transistor is coupled to the second device input.

8. The circuit of claim 1, wherein the circuit is coupled to a power network.

9. The circuit of claim 8, wherein both the circuit and the power network form part of an integrated circuit die.

10. The circuit of claim 9, wherein the integrated circuit die is a memory die.

11. The circuit of claim 10, wherein the memory die comprises a hardware interface according to a dual data rate (DDR) standard.

12. The circuit of claim 11, wherein the suppression device draws power from the first device input when the suppression device is active, the suppression device being configured to be active at least before and after a traffic burst over the hardware interface.

13. A non-transitory computer-readable medium comprising instructions that, when executed by one or more processors of a computing device, cause the computing device to generate a circuit design by performing operations comprising:

configuring, in the circuit design, an attenuator coupled to a circuit input;

configuring, in the circuit design, a low-pass filter coupled to an output of the attenuator;

configuring, in the circuit design, an operational amplifier that comprises a first amplifier input coupled to the output of the attenuator, and a second amplifier input coupled to an output of the low-pass filter;

configuring, in the circuit design, a driving stage coupled to an output of the operational amplifier; and configuring, in the circuit design, a suppression device that comprises a first device input coupled to the circuit input, and a second device input coupled to an output of the driving stage.

14. The non-transitory computer-readable medium of claim 13, wherein the suppression device draws power from the first device input when the suppression device is active.

15. The non-transitory computer-readable medium of claim 13, wherein the driving stage comprises a plurality of inverters coupled in series.

16. The non-transitory computer-readable medium of claim 13, wherein the operational amplifier has offset control.

17. The non-transitory computer-readable medium of claim 13, wherein the operational amplifier comprises a third input, an amplified output provided by the output of the operational amplifier being offset by the operational amplifier based on an offset control signal received via the third input.

18. The non-transitory computer-readable medium of claim 17, wherein the amplified output determines a threshold voltage level for the circuit, the threshold voltage level determining when the suppression device is active and inactive.

19. The non-transitory computer-readable medium of claim 13, wherein the suppression device comprises a p-type transistor and an n-type transistor, wherein the first device input is coupled to a source of the p-type transistor, wherein a drain of the p-type transistor is coupled to a source of the n-type transistor, wherein a drain of the n-type transistor is coupled to ground, wherein a gate of the p-type transistor is coupled to ground, and wherein a gate of the n-type transistor is coupled to the second device input.

20. The non-transitory computer-readable medium of claim 13, wherein an active suppression circuit comprises the attenuator, the low-pass filter, the operational amplifier, the driving stage, and the suppression device, and wherein the active suppression circuit is coupled to a power network.

* * * * *